United States Patent [19]

Sim

[11] Patent Number: 5,361,964
[45] Date of Patent: Nov. 8, 1994

[54] SOLDERING APPARATUS AND METHOD

[75] Inventor: Ah T. Sim, Singapore, Singapore

[73] Assignee: Sun Industrial Coatings Private Limited, Singapore, Singapore

[21] Appl. No.: 32,482

[22] Filed: Mar. 17, 1993

[30] Foreign Application Priority Data

Mar. 17, 1992 [GB] United Kingdom ............... 9205844

[51] Int. Cl.⁵ .............................................. B23K 3/06
[52] U.S. Cl. ..................................... 228/56.2; 118/57; 118/423; 118/429; 118/500
[58] Field of Search .............. 228/262, 111.5, 180.21, 228/56.2; 118/57, 500, 400, 423, 429, 503

[56] References Cited

U.S. PATENT DOCUMENTS

| | | | |
|---|---|---|---|
| 3,661,638 | 5/1972 | Lemecha | 118/57 X |
| 3,767,102 | 10/1973 | Parsons | 118/400 X |
| 3,834,015 | 9/1974 | Di Renzo | 29/628 |
| 4,210,095 | 7/1980 | Rouquie | 118/57 |
| 5,164,010 | 11/1992 | Morozumi | 118/429 X |
| 5,260,098 | 11/1993 | Trentesaux et al. | 118/57 X |

FOREIGN PATENT DOCUMENTS 0249168 12/1987 European Pat. Off.
1446636 8/1976 United Kingdom.

Primary Examiner—Kenneth J. Ramsey
Attorney, Agent, or Firm—Bacon & Thomas

[57] ABSTRACT

Apparatus (1) for applying solder to electrical components such as integrated circuit packages (2) has a chamber (4) which contains a body of solder. The chamber (4) has outlet openings (10) which are below the surface of the solder and from which a flow of solder is provided. Since dross (oxidized solder) floats on the surface of the solder, the flow of solder is relatively pure. The leads of the packages are dipped into the flow of solder so that they are coated with a protective layer of solder. Vibrational apparatus (2) is also provided to vibrate the circuit packages (2) during the dipping of the packages (2) into the solder flow. In this way solder is prevented from bridging the spacing between two closely spaced, adjacent leads.

10 Claims, 4 Drawing Sheets

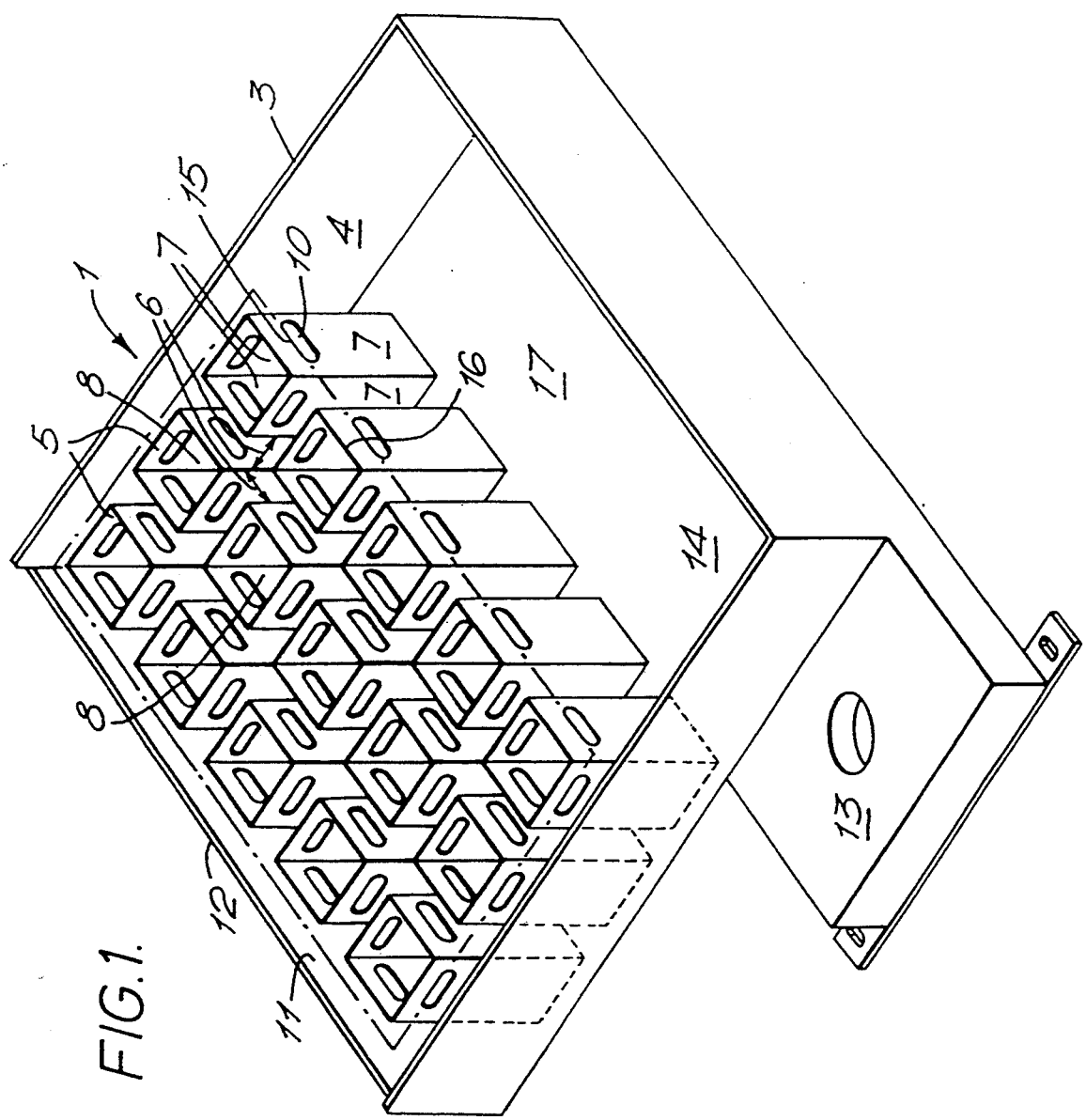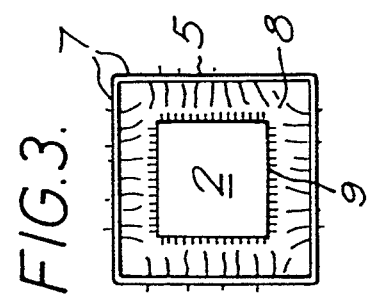

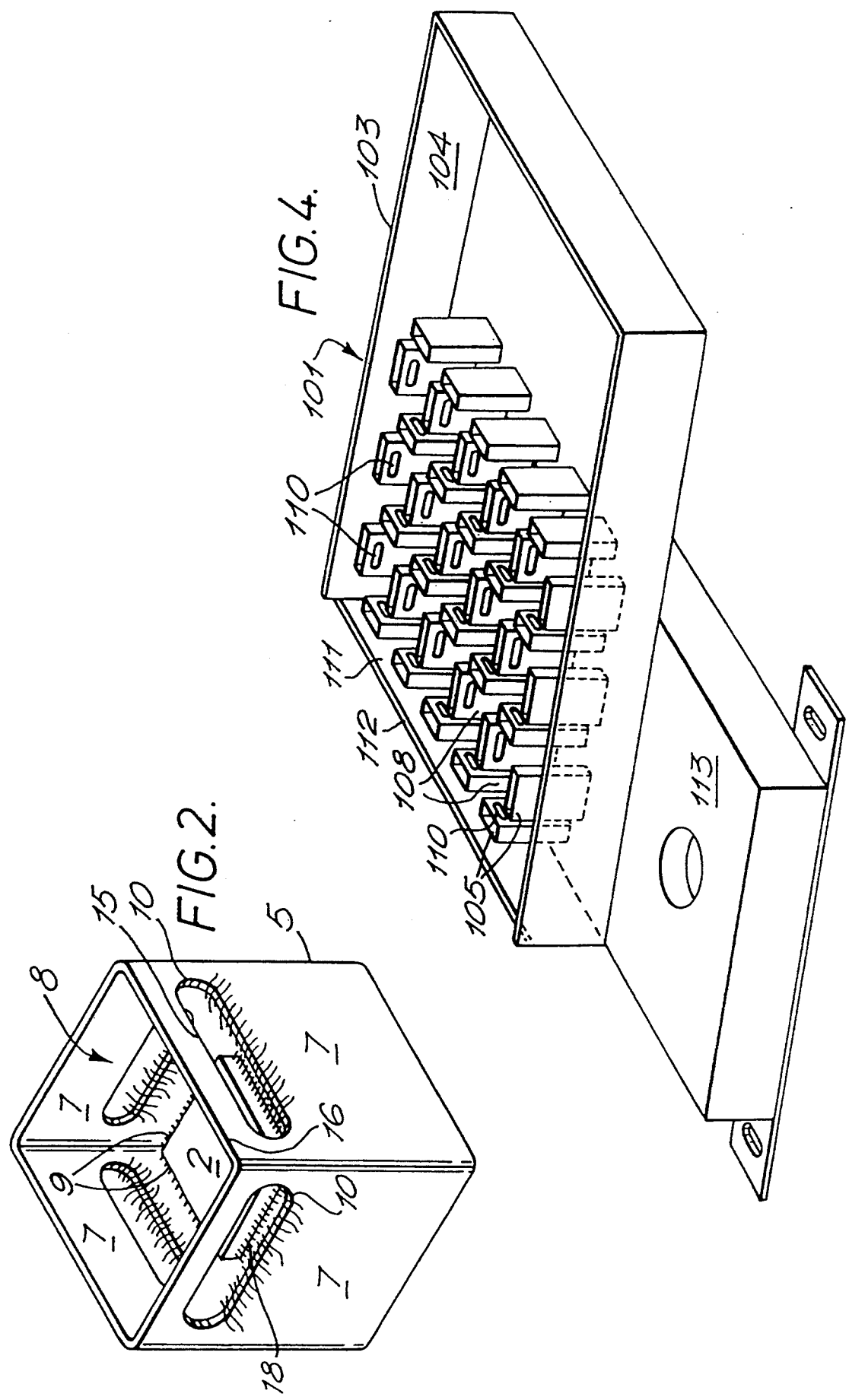

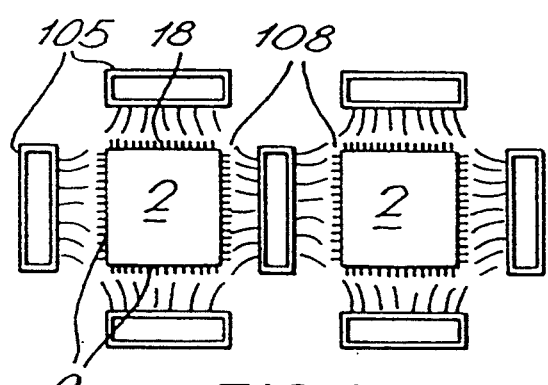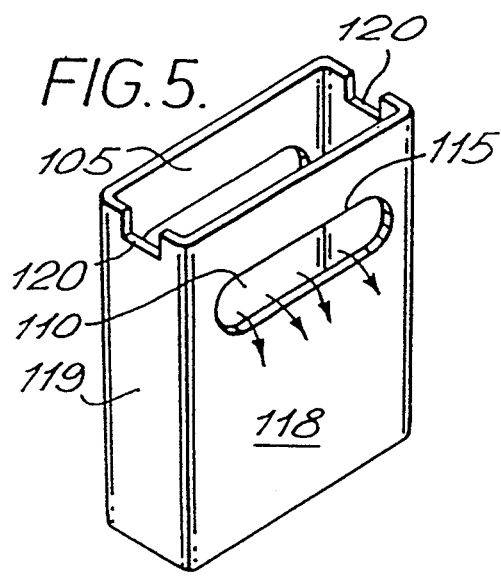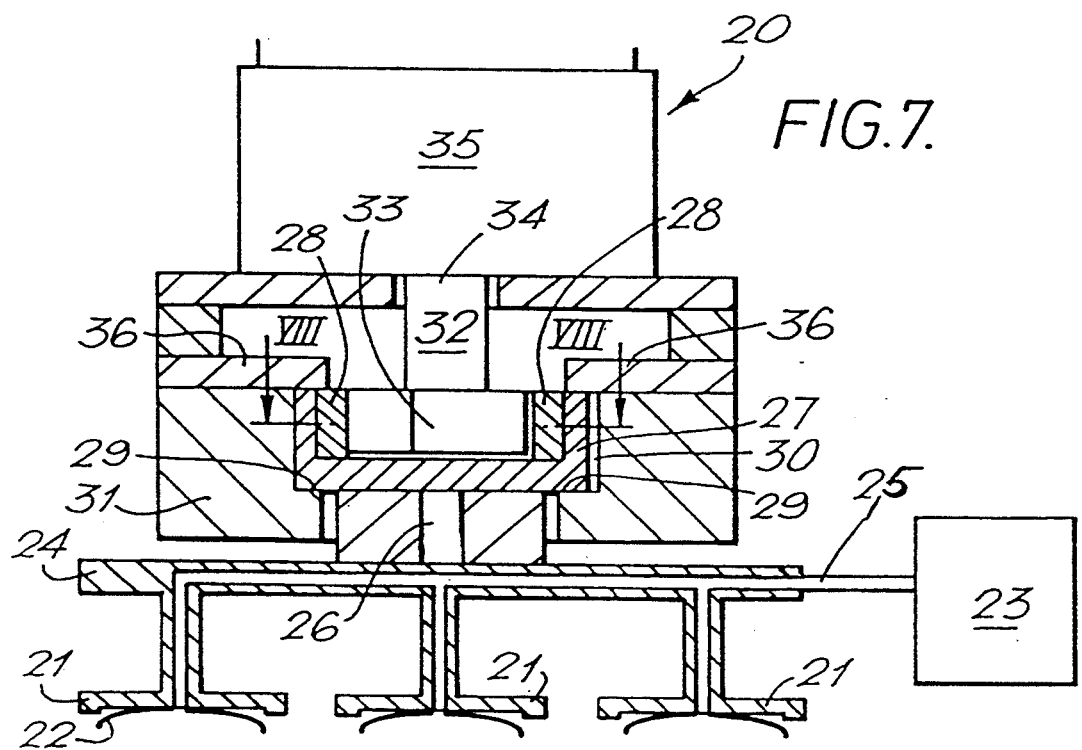

SOLDERING APPARATUS AND METHOD

The present invention relates to an apparatus and method for applying solder to electrical or electronic components. The invention is particularly suitable for the application of solder to the leads of integrated circuit packages.

Integrated circuit packages now come in a variety of different forms. For example "dual-in-line packages" ("DIP's") have a generally rectangular body with leads projecting from two opposing sides. "Plastic leadless chip carriers" known as "PLCC's" and "small outline integrated circuits" known as "SOIC's" are two further examples of integrated circuit packages. The latter two packages are formed from "quad flat packs" which have a relatively flat body, rectangular in plan view and with leads projecting from all four sides generally in the same plane as the flat body. The leads, normally of copper, are bent to the required shape so as to form either a PLCC or a SOIC. The shape of the leads can be e.g. stepped or J-shaped.

Current quad flat packs available may have 20 to 200 or more leads along each side and are generally square or rectangular or similarly shaped in plan view. The spacing between the leads, i.e. their pitch, can vary from 0.100 inches (2.5 mm) down to as small as 0.010 inches (0.25 mm) or even smaller.

The leads of electronic components and in particular the leads of integrated circuit packages are usually precoated with solder to provide them with a protective coating before they are mounted e.g. on a printed circuit board.

There are a number of methods known for achieving such precoating. Electroplating is one such method. However, this method has the disadvantage that it is possible to plate on even those surfaces which have been contaminated by dirt, grease or oxidation. If a coated lead having a contaminated surface is connected to the printed circuit board, the resulting connection is weakened and can result in malfunction. To avoid this problem, solder coating is preferred by the end-user since solder will not attach to a contaminated surface so the risk of forming a weakened connection is reduced. Moreover, during the trim and form process, the cross-section of the leads being trimmed will have exposed base matter. This will result in eventual oxidation and hence defeat the purpose of a protective coating.

One method of solder coating is known from European Patent Application No. 0171257 which discloses a wave soldering method. In this system, a carrier for the integrated circuit packages is passed over a bath of solder in which a standing wave is formed. The arrangement is such that the component portions to be coated pass through the peak of the standing wave of solder as the carrier is moved over the bath.

Another method, known as drag soldering, is disclosed in European Patent Application No. 0252771. In drag soldering, the carrier which holds the circuit packages is moved down into the solder, through the solder and then upwardly to remove the packages from the solder. During the entire operation, the carrier is kept in a horizontal orientation.

However, when the wave or drag soldering methods are used for leads having a small spacing between adjacent leads, such as 0.025 inches (0.64 mm) or smaller, capillary action of the solder can cause the spacing to be bridged resulting in a short circuit. Bridging is normally checked for by eye and this is time consuming and expensive, as well as unreliable with small spacings.

According to one aspect of the invention, there is provided apparatus for applying solder to the leads of an electrical or electronic component, comprising a holder for holding a component during dipping of the leads thereof into solder, and vibratory means coupled to said holder for generating vibratory motion of said component, said vibratory motion being such that the component is moved at such a speed and to such an extent that solder bridging between adjacent leads is substantially prevented.

According to another aspect of the invention, there is provided a method for applying solder to the leads of an electrical or electronic component, such as an integrated circuit package, comprising the steps of holding the component, dipping the leads of the component into solder, and vibrating the component during said dipping step at such a speed and to such an extent that solder bridging between adjacent leads is substantially prevented.

The vibratory motion will tend to throw excess solder off the leads, thereby overcoming the capillary action of solder between leads. Thus bridging between two or more adjacent leads is substantially prevented. A thin, even coating of solder may be achieved. Furthermore, the scrubbing effect of the vibratory motion tends to prevent impurities in the solder from adhering to the leads of the component. Such impurities may be the result of contamination of the solder or they may be in the form of dross which results from oxidation of the solder.

It has also been found that such apparatus results in benefits when used during other non-soldering stages of the operation such as during washing, cleaning and rinsing. This is because the vibration results in an enhancing of the cleaning action etc.

The vibratory motion is preferably mechanically generated and mechanically transmitted to the holder. Generation of vibratory motion by ultrasound, for example, will not be satisfactory since the frequency will be too high and the amplitude too small.

Preferably the vibratory means is arranged to generate vibratory motion of the component substantially in the plane containing the leads thereof. There will normally be one plane of vibration. It is preferable to maintain the component in a horizontal orientation during dipping to ensure an even coating of solder, so that the plane of vibration is advantageously a horizontal plane. The component may then be vertically lowered into the solder and vertically lifted therefrom whilst undergoing vibrations in a horizontal plane.

The vibratory means may be arranged to vibrate the component in more than one direction in the plane containing the leads, for example, in at least two different directions containing perpendicular components to each other. Preferably the two directions are perpendicular to each other. This is particularly useful for a quad flat pack where leads extend from each of the four sides thereof.

Thus in a preferred embodiment, the vibratory means is arranged to vibrate the component forwards and rearwards in a first direction and forwards and rearwards in a second direction perpendicular to the first. The amplitude of vibration in the two directions may be substantially equal to each other. A complete cycle of vibration may consist of a forward and rearward movement in the first direction followed by a forward and rearward movement in the second direction, but preferably the cycle comprises, in succession: a forward movement in the first direction, a forward movement in the second direction, a rearward movement in the first direction and a rearward movement in the second direction. Thus the component may follow a generally rectangular or square path of movement.

The vibratory means may include a rotatable cam engageable with a cam follower connected to the holder. A second rotatable cam and cam follower may be provided to impart vibrations in a second direction. The cam follower(s) may be resiliently biased against the cam(s) to maintain engagement therewith.

In a preferred arrangement, the vibratory means comprises a drive member arranged to rotate about an axis thereof and a driven member connected to the holder, the driven member being arranged for limited movement about said axis in response to contact between portions of said drive and driven members during rotation of said driven member. The limited movement may be achieved by arranging the driven member in a recess which has slightly larger dimensions, thereby permitting vibration within the recess. The limited movement may be permitted in one plane only. Thus in the preferred arrangement where the plane of movement is horizontal, the driven member may be arranged in a recess which permits lateral vibratory movement in the recess but prevents vertical movement therein.

In a simple form, the drive member may have a single contact portion arranged to contact one or more contact portions of the driven member during rotation. Preferably, both the drive member and the driven member have a plurality of contact portions. In a preferred embodiment, the drive member has a plurality of circumferentially spaced contact portions and the driven member has a plurality of circumferentially spaced contact portions, the spacings between the contact portions of the drive member being different from the spacings between the contact portions of the driven member. This will ensure that a plurality of contacts, each imparting a movement to the holder, take place during one revolution of the drive member.

The different spacings may for example be provided by arranging one of the drive member and the driven member to have an odd number of contact portions and the other of the drive member and driven member to have an even number of contact portions. Thus for example the drive member may have "n" contact portions and the driven men, her "n−1" contact portions. In a preferred embodiment, the drive member has five contact portions and the driven member has four contact portions. As described in more detail below, with this arrangement a complete cycle of vibration of the driven member occurs for each 72° of rotation by the drive member.

Repeated intermittent contact between the contact portions should not result in undue wear provided that they are appropriately shaped. For example, the contact portions of the drive member may be defined by the corners which may be slightly rounded of a substantially regular sided figure, for example a triangle, square, pentagon, hexagon etc. The contact portions of the driven member may for example be of circular cross-section. These arrangements can reduce the likelihood of damage when the contact portions make contact, or collide, during rotation of the drive member.

An electric motor is preferably provided to drive the vibratory means. In certain embodiments, the arrangement may be such that the motor is stepped down. This reduces the speed of the motor to drive the vibratory means at the desired speed but increases the torque which is applied to the mechanism. Thus a high speed motor, for example 1200 rpm, may be stepped down by suitable gearing to 600 rpm.

Preferably, the vibratory means is arranged to generate vibrations with a frequency in the range 50 Hz to 500 Hz, more preferably 50 Hz to 150 Hz. It is preferred for the amplitude of vibration to be in the range of 0.25 mm to 10 mm, more preferably 0.25 mm to 2.00 mm.

The holder may take various forms, but in a preferred form comprises a vacuum cup or clamp. A plurality of vacuum cups or clamps may be arranged in a row or plurality of rows so that more than one component can be vibrated at a time.

The component may be dipped into solder using a known wave or drag soldering system in conjunction with the present invention. It is possible that the vibratory motion will generate air bubbles, promoting the formation of dross, but this can be avoided by providing an inert atmosphere, such as nitrogen, in the region where dipping is to occur. Preferably, the apparatus further comprises a chamber arranged to contain a body of solder with an upper surface, the chamber having an outlet opening arranged to be below said upper surface, wherein, in use, a flow of solder is discharged from the outlet opening to a cavity adjacent thereto where a component is dipped into the solder flow. Since the solder to be applied to the component flows from a region of the chamber below the upper surface of the solder, where the solder is not exposed to atmosphere, the solder is substantially free from dross and thus the quality of the coating is improved. Air bubbles generated by the vibration will tend to be carried away by the relatively fast flow of solder.

Certain preferred embodiments of the invention will now be described by way of example and with reference to the accompanying figures in which:

FIG. 1 shows a schematic perspective view of a first dipping system for applying solder to quad flat packs;

FIG. 2 shows an enlarged perspective view of a hollow post of the first dipping system;

FIG. 3 shows a plan view of the hollow post of the first dipping system;

FIG. 4 shows a schematic perspective view of a second dipping system for applying solder to quad flat packs;

FIG. 5 shows an enlarged perspective view of a hollow post of the second dipping system;

FIG. 6 shows a schematic plan view of part of the second dipping system;

FIG. 7 shows a schematic sectional view of apparatus for causing vibratory motion.

Figure 8A:
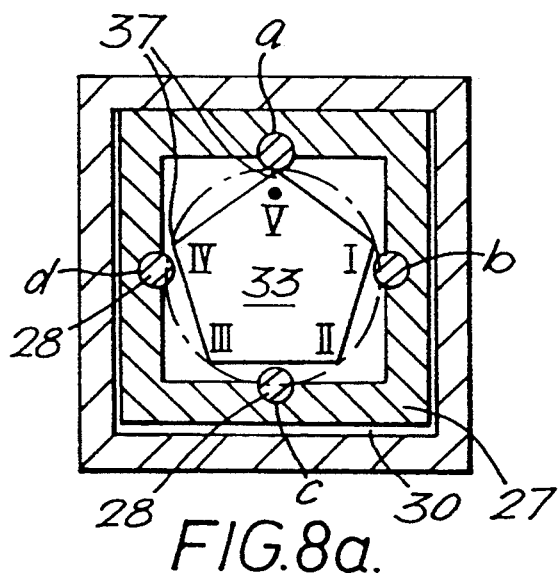
FIGS. 8a to 8d show cross-sections of the apparatus of FIG. 7 (taken along lines VIII—VIII) in four different positions.
Figure 8B:
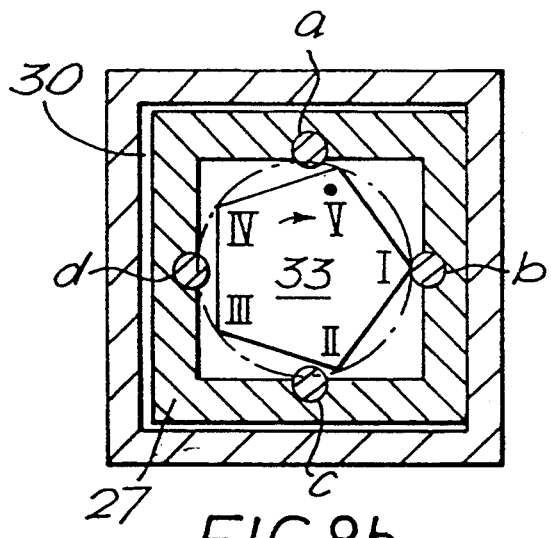
Figure 8C:
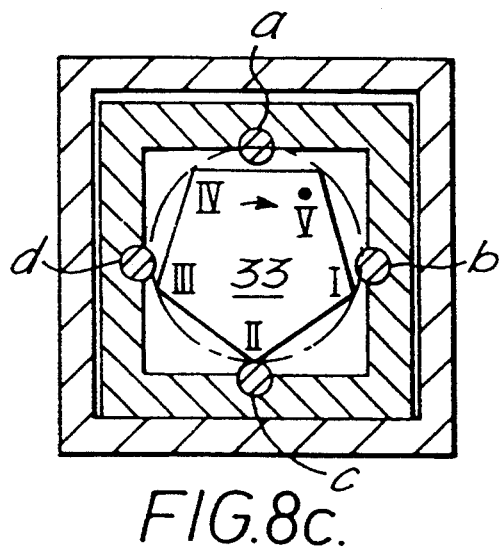
Figure 8D:
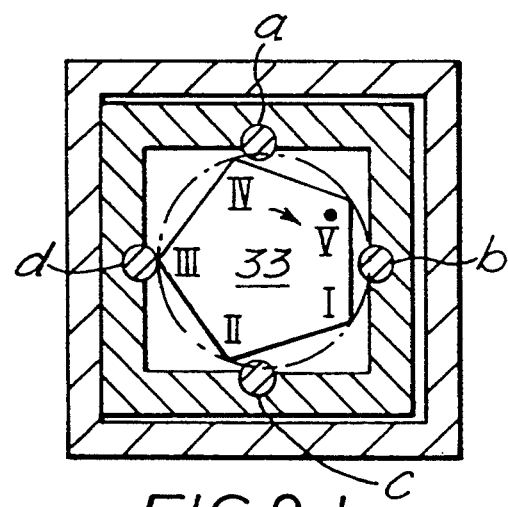

The first dipping system 1 for applying solder to quad flat packs 2 will now be described with reference to FIGS. 1 to 3. A tank 3 provides a chamber 4 for a body of molten solder. Heating elements (not shown) are arranged in the bottom of the tank 3 and are appropriately controlled to keep the solder at the correct temperature. A number of hollow posts 5 are arranged in the tank 3, each post 5 having a cross sectional shape which is substantially square so as to receive a correspondingly shaped quad flat pack 2. The posts 5 are regularly arranged in parallel rows to form an array.

Each post 5 is spaced apart from the adjacent post by a spacing 6.

Each hollow post 5, as can be clearly seen from FIGS. 2 and 3, has four upwardly extending walls 7 which form a square cavity 8 arranged to receive a quad flat pack 2 therein with the sides 9 thereof being parallel to each of the four walls 7. Each wall 7 is formed with a solder outlet opening in the form of an elongate slot 10. The tank 3 and the hollow posts 5 are preferably of titanium but can be of any suitable material.

Along one side 11, the tank is provided with an overflow 12 for regulating the level of solder contained therein.

A pump 13 is arranged at a location below the level of the hollow posts 5 and to one side 14 of the tank. The pump 13 is arranged so as to be able to maintain the level of the solder at least at the level of the overflow 12 which is above the upper edges 15 of the outlet slots 10 but below the top 16 of the hollow posts 5. At the bottom of each hollow post there is a drain hole (not shown) through which solder in the cavity 8 is removed. The removed solder can then be repumped through the system via the pump 13.

A region 17 of the tank is arranged so as to be free from any hollow posts 5 so that the surface of the solder can be skimmed to remove any dross which accumulates on the surface of the solder.

The operation of the first dipping system will now be explained. The pump 13 supplies solder at a rate sufficient for it to pass over the overflow 12 so that the solder has an upper surface with a level below the top of the hollow posts 5 but above the elongate slots 10. Any dross floats on the upper surface. At the lower level of the elongate slots 10, solder surrounding each hollow post 5 flows into the cavity 8 within the post 5 through the slots 10. The flow of solder forms a cascade of dross free solder into the path of which the leads 18 of the quad flat pack 2 are dipped so as to be coated with solder. Since solder is removed from the cavities 8 via the drain hole, they do not fill up with solder. Periodically, the surface of the solder in the part 17 of the tank 3 which is free from the hollow posts 5 is skimmed so as to remove any dross accumulated on the surface. Additional solder need only be periodically added since unused solder is repumped through the system.

A second dipping system 101 for applying solder to quad flat packs 2 will now be described with reference to FIGS. 4 to 6. As with the first system, the apparatus has a tank 103 which provides a chamber 104 for a body of molten solder. Heating elements (not shown) are arranged at the bottom of the tank and are controlled to keep the solder at the correct temperature. In this dipping system, the cavity 108 for a quad flat pack 2 is located between a set of four hollow posts 105. The hollow posts 105 are substantially oblong shaped and have a solder outlet opening in the form of an elongate slot 110 on each of their longer sides 118, thereby providing a solder outlet for two adjacent cavities 108. The hollow posts 105 are arranged in an array to form an array of cavities 108. The posts 105 at the periphery of the array have only one elongate slot 110 facing inwardly. An overflow 112 is provided along one side 111 of the tank for removing solder therefrom. In this system the overflow 112 is below the elongate slots 110 of the hollow posts.

As with the first dipping system, the level of the elongate slots 110 is arranged so as to be parallel to and slightly above the sides 9 of the quad flat packs 2 when they are lowered into the cavities 108 defined by the sets of four hollow posts 105. The bottom portions of the hollow posts 105 are interconnected, for example by a manifold (not shown), such that the posts 105 all form part of a common chamber for solder which is supplied by a pump 113 arranged at a location below the hollow posts 105. The pump 113 is arranged to maintain the solder level in the posts 105 above the upper edges 115 of the elongate slots 110 but below the top of the hollow posts 105.

At the top of each of the two shorter walls 119 of the hollow posts 105, there are cutout portions 120 which define an overflow for regulating the level of solder in the hollow posts 105. Thus solder at the top of the posts 105, where dross will tend to accumulate, can overflow out of the hollow posts 105 in a direction away from the leads 18 of the quad flat packs 2, via the cutout portions 120.

The operation of the second dipping system will now be explained. Solder is supplied by the pump 113 to the hollow posts 105 and flows therefrom through the slots 110 so as to form cascades. The leads 18 of the quad flat packs 2 are dipped in the cascades so as to be coated with solder. The level of solder in the posts 105 is regulated by the cutout portions 120 at each end thereof, via which solder overflows. This also ensures that dross is removed from the hollow posts. The solder flowing out of the posts 105 via both the elongate slots 110 and the cutout portions 120 collects in the region of the tank surrounding the posts 105 and is then returned to the pump 113 by overflowing over the overflow 112 at the side of the tank 111.

Reference will now be made to FIGS. 7 and 8A to 8D which schematically show apparatus 20 for subjecting the quad flat packs 2 to vibratory motion during dipping, suitable for use with the apparatus of FIGS. 1 to 3 or that of FIGS. 4 to 6. The apparatus 20 has a number of holders 21, each of which is capable of holding a quad flat pack 2. Only three of these holders 21 are shown in FIG. 7. The holders comprise vacuum cups 22 which are coupled to a vacuum source 23 which when switched on causes the quad flat packs 2 to be held against the cups 22 by a sucking action. The cups 22 are of titanium which is a particularly advantageous metal in that it does not pick up solder, is thermally stable and is inert. Alternatively, the vacuum cups 22 may be made of rubber or thermoplastic. The holders 21 are each attached to a horizontal rigid mounting plate 24 through which vacuum lines 25 extend between each of the cups 22 and the vacuum source 23.

A vertical shaft 26 is fixedly connected to the mounting plate 24. The shaft 26 is arranged so as to be vibrated such that the mounting plate 24 and the holders 21 vibrate in a horizontal plane. The shaft 26 is fixedly attached, at its end remote from the mounting plate 24, to a cuboidally shaped box 27. The box is open topped and has a substantially square cross section. Four upright posts 28 are arranged in the interior of the box 27, each post 28 being located mid-way along each of the sides of the box. The posts 28 protrude a small distance into the interior of the box as can be seen from FIG. 8.

The box 27 is itself movably received on a ledge 29 in a substantially square recess 30 of a casing 31. The recess 30 and the ledge 29 have dimensions slightly larger in both directions than the external dimensions of the box 27. The box 27 is free to vibrate within the recess 30 of the casing 31.

A rotatable drive shaft 32 has a portion 33 of pentagonal cross sectional shape arranged in the box 27 and a narrower portion 34 of substantially circular cross section arranged above the pentagonal portion 33 and the open top of box 27. The narrower portion 34 is coupled to a drive motor 35. The drive shaft 32 is fixed in position relative to the casing 31 and movement of the drive shaft 32 causes the box 27 to move within the recess 30. Retaining members 36 extend from the casing 31 to a position above the box 27 to prevent the box 27 from moving upwardly out of the recess 30. The box 27 is thus retained between the ledge 29 and the retaining members 36 so as to be movable in the recess 30 in a horizontal plane.

In operation, the quad flat packs 2 are held against the holders 21 by the vacuum cups 22 and are lowered so that each quad flat pack 2 is received in a cavity such as described in relation to FIGS. 1 to 3. As the cups 22 are lowered, the drive shaft 32 is rotated by the motor 35. As the drive shaft 32 rotates, successive corners 37 of the pentagon strike in succession the four upright posts 28 in the box 27, thereby causing the box 27 to be moved in the recess 30 to follow a generally square shaped path of movement. Successive positions of the box 27 during rotation of the drive shaft 32 can be seen from FIGS. 8a to 8d.

For ease of reference, the five corners 37 of the pentagonal cross-section of the drive shaft 32 have been numbered I to V and the four posts 28 of the box 27 have been referenced by the letters a to d. In FIG. 8a, corner V is striking post a to cause the box 27 to move to the extreme right of the recess 30. As can be seen from FIG. 8b, when the drive shaft 32 has rotated by 18°, corner I strikes post b causing the box 27 to move in the "downward" direction of the figures as far as is permitted by the recess 30. After a further 18° of rotation, corner II strikes post c as can be seen from FIG. 8c to move the box 27 to the extreme left of the recess 30. Finally, after another 18° of rotation of the drive shaft, corner III strikes post d, to thus move the box to the extent permitted by the recess in the "upward" direction of the figures. This can be seen from FIG. 8d. Thus only one fifth of a complete rotation i.e. 72° of rotation of the drive shaft 32 is sufficient to cause the box 27 to complete a cycle consisting of a square shaped path of movement. This vibrational movement may be in the range of 0.25 mm to 10 mm, more preferably 0.25 mm to 2 e.g. 1 mm in each direction. The frequency of vibration is preferably in the range of 50 to 500 Hz, more preferably 50 to 150 Hz. However, it will be appreciated that any suitable frequency and amplitude of movement are all possible within the scope of the present invention.

The vibratory apparatus can be used during all stages of the processing of quad flat packs during insertion, dipping and removal from the tank. Furthermore, this apparatus can be used during the washing and cleaning steps as the vibration movement provides a scrubbing effect.

I claim:

1. Apparatus for applying solder to the leads of an electrical or electronic component, comprising a holder for holding a component during dipping of the leads thereof into solder, and vibratory means coupled to said holder for generating vibratory motion of said component, said vibratory motion being such that the component is moved at such a speed and to such an extent that solder bridging between adjacent leads is substantially prevented, wherein said vibratory means comprises a drive member arranged to rotate about an axis thereof and a driven member connected to the holder, the driven member being arranged for limited movement about said axis in response to contact between portions of said drive and driven members during rotation of said driven member.

2. Apparatus as claimed in claim 1, wherein said vibratory means is arranged to generate vibratory motion of the component substantially in the plane containing the leads thereof.

3. Apparatus as claimed in claim 2, wherein said vibratory means is arranged to vibrate the component in at least two different directions in said plane, said two directions containing perpendicular components to each other.

4. Apparatus as claimed in claim 3, wherein said two directions are perpendicular to each other.

5. Apparatus as claimed in claim 1, wherein the drive member has a plurality of circumferentially spaced contact portions and the driven member has a plurality of circumferentially spaced contact portions, the spacings between the contact portions of the drive member being different from the spacings between the contact portions of the driven member.

6. Apparatus as claimed in claim 5, wherein one of the drive member and the driven member has an odd number of contact portions and the other of the drive member and the driven member has an even number of contact portions.

7. Apparatus as claimed in claim 6, wherein said drive member has five contact portions and said driven member has four contact portions.

8. Apparatus as claimed in claim 1, wherein the vibratory means is arranged to generate vibrations with a frequency in the range 50 Hz to 500 Hz.

9. Apparatus as claimed in claim 1, wherein the vibratory means is arranged to generate vibrations with an amplitude in the range 0.25 mm to 10.00 mm.

10. Apparatus as claimed in claim 1, further comprising a chamber arranged to contain a body of solder with an upper surface, the chamber having an outlet opening arranged to be below said upper surface, wherein, in use, a flow of solder is discharged from the outlet opening to a cavity adjacent thereto where a component is dipped into the solder flow.

* * * * *